United States Patent
Marsh et al.

(10) Patent No.: US 6,717,970 B2
(45) Date of Patent: Apr. 6, 2004

(54) LASERS

(75) Inventors: John Haig Marsh, Glasgow (GB); Craig James Hamilton, Bishopton (GB)

(73) Assignee: The University Court of the University of Glasgow (GB)

(*) Notice: Subject to any disclaimer, the term of this patent is extended or adjusted under 35 U.S.C. 154(b) by 0 days.

(21) Appl. No.: 09/788,752

(22) Filed: Feb. 20, 2001

(65) Prior Publication Data

US 2002/0097765 A1 Jul. 25, 2002

(30) Foreign Application Priority Data

Jan. 23, 2001 (GB) .......................... 01 01 689

(51) Int. Cl.$^7$ .............................. H01S 5/00; H01S 3/14
(52) U.S. Cl. ........................................... 372/50; 372/68
(58) Field of Search ...................... 372/50, 68

(56) References Cited

U.S. PATENT DOCUMENTS

| | | |
|---|---|---|
| 4,282,494 A | 8/1981 | Yonezu et al. |
| 4,511,408 A | 4/1985 | Holonyak, Jr. |
| 4,585,491 A | 4/1986 | Burnham et al. |
| 4,594,603 A | 6/1986 | Holonyak, Jr. |
| 4,639,275 A | 1/1987 | Holonyak, Jr. |
| 4,727,556 A | 2/1988 | Burnham et al. |
| 4,845,216 A | 7/1989 | Taylor et al. |
| 4,845,727 A | 7/1989 | Murray |
| 4,857,971 A | 8/1989 | Burnham |
| 4,871,690 A | 10/1989 | Holonyak, Jr. et al. |
| 5,384,797 A | 1/1995 | Welch et al. |
| 5,764,669 A | 6/1998 | Nagai |
| 5,873,818 A * | 2/1999 | Rothfels ........ 600/188 |

FOREIGN PATENT DOCUMENTS

EP    1052747    5/2000    ........ H01S/5/10

OTHER PUBLICATIONS

Hamilton et al. "Single Lobed Far–field Operation of Extended Cavity AlGaInP Lasers," Lasers and Electro–Optics Society Annual Meeting, 1998, LEOS '98 IEEE, vol. 2, pp. 291–292.*

Ooi et al. "Quantum–Well Intermixing in GaAs–AlGaAs Structures Using Pulsed Irradiation," IEEE Photonics Technology Letters, May 1997, vol. 9 No. 5, pp. 587–589.*

Banerji J et al., "Comparison of Talbot and 1–to–N–way phase–locked array resonators", Applied Optics, Mar. 1, 1997, Opt. Soc. America, USA, vol. 36, No. 7, pp. 1604–1609.

Pezeshki B et al., "12 nm tunable WDM source using an integrated laser array", Electronics Letters, IEE Stevenage, GB, vol. 36, No. 9, Apr. 27, 2000, pp. 788–789.

McIlvaney et al., "Far–field behaviour of 980 nm broad area lasers incorporating bandgap widened extended slab waveguides", Oct. 26, 1994, IEEE (1995).

Qian et al., "Three Band–gap QW Intermixing in InP/InGaAs/InGaAsP System for Monolithically Integrated Optical Switch", IEEE 1998, pp. 194–195.

Marsh et al., "Quantum well intermixing in material systems for 1.5 um (invited)", J. Vac. Sci. Technol. A, vol. 16, No. 2, pp. 810–816, Mar./Apr. 1998.

(List continued on next page.)

Primary Examiner—Paul Ip
Assistant Examiner—James Menefee
(74) Attorney, Agent, or Firm—Piper Rudnick LLP; Jefferson Perkins

(57) ABSTRACT

There is disclosed an improved laser device (10), comprising a semiconductor laser diode. The invention provides laser device (10) comprising: at least two lasing regions (12,14); an interference region (16) into which an output of each lasing region (12,14) is coupled; and an output region (118) extending from the interference region (116) to an output (20) of the device (10).

34 Claims, 2 Drawing Sheets

OTHER PUBLICATIONS

Camacho et al., "Laser structure for generating high optical power in a singlemode waveguide", Electronics Letters, vol. 34, No. 5, pp. 460–461, Mar. 5, 1998.

Hamilton et al., "Bandgap tuning of visible material", Mar. 5, 1998, Electronics Letters, vol. 34, No. 7, pp. 665–666, Apr. 2, 1998.

Kowalski et al., "Fabrication of narrow far–field InGaAs–InAIGaAs broad–area lasers using quantum well intermixed extended cavities", CLEO, Monday Morning, May 4, 1998, pp. 37–38.

Carpenter et al., "SIMS analysis of InGaAs/InAl GaAs wafers—Report No. SI/GLU/6725", Institute of Surface Science and Technology, Loughborough University, Apr. 27, 1998, 26 pgs.

Marsh et al., "Monolithic integration in III–V semiconductors via a universal damage enhanced quantum well intermixing technique", Part of the SPIE Conference on Materials Modification by Ion Irradiation, Quebec, Canada, Jul. 1998, SPIE vol. 3413, 9 pgs.

Saher, Helmy A., "Micro Raman studies of disordering due to dielectric cap annealing in GaAs/AlGaAs heterostructures; A Progress Report", May 5, 1998, 23 pgs.

McDougall et al., "Monolithic Integration via a Universal Damage Enhanced Quantum–Well Intermixing Technique", IEEE Journal of Selected Topics in Quantum Electronics, vol. 4, No. 4, Jul./Aug. 1998.

Helmy et al., "Quantitative Model for the Kinetics of Compositional Intermixing in GaAs–AlGaAs Quantum–Confined Heterostructures", IEEE Journal of Selected Topics in Quantum Electronics, vol. 4, No. 4, pp. 653–660, Jul./Aug. 1998.

Ke et al., "The electronic structure and optical properties of intermixed GaAs/AlGaAs double quantum wells", Journal of Applied Physics, vol. 84, No. 5, pp. 2855–2857, Sep. 1, 1998.

Li et al., "Silica capping for Al 0.3Ga 0.7 As/GaAs and In0.2Ga0.8As/GaAs quantum well intermixing", Applied Physics Letters, vol. 73, No. 23, pp. 3393–3395, Dec. 7, 1998.

Helmy et al., "Control of silica cap properties by oxygen plasma treatment for single–cap selective impurity free vacancy disordering", Applied Physics Letters, vol. 74, No. 5, pp. 732–734, Feb. 1, 1999.

McDougall et al., "GaAs/AlGaAs waveguide pin photodiodes with non–absorbing input facets fabricated by quantum well intermixing", Electronics Letters, vol. 36, No. 8, pp. 749–750, Apr. 13, 2000.

Liu et al., "Fabrication of Monolithically Integrated Mach–Zender Asymmetric Interferometer Switch", IEEE 2000, pp. 412–414.

"A 13764 Al–quat MQW structure Intermixing PL shifts recorded for control sample sputterred on week 1 and annealed each week", 4 pgs. No date.

"Intermixing Process control meeting: Effect of change of control TC from edge to centre", 1 pg., Apr. 6, 2000.

Qui et al., "Monolithically Integrated Fabrication of 2×2and 4×4 Crosspoint Switches Using Quantum Well Intermixing", pp. 415–418, IEEE 2000.

Ke et al., "Monolithically integrated distributed Bragg reflector lasers for 1.5 um operation with band gap shifted grating section", Optical Materials 14 (2000), pp. 193–196.

McDougall et al., "Harmonic modelocking at up to 440GHz repetition rates in InGaAs–InAlGaAs quantum well lasers", Department of Electronics and Electrical Engineering, University of Glasgow, No date.

Kowalski et al., "Monolithic integration in InGaAS–InA1GaAs optoelectronic devices for 1.55 um emission by quantum well intermixing", Department of Electronics and Electrical Engineering, University of Glasgow, No date.

Teng et al., "Dual–Wavelength Laser Source Monolithically Integrated with Y–Junction Coupler and Isolater Using Quantum–Well Intermixing", IEEE Photonics Technology Letters, vol. 12, No. 10, pp. 1310–1312, Oct. 2000.

Kudo et al., "1.55 um Wavelength–Selectable Microarray DFB–LD's with Monolithicallly Integrated MMI Combiner, SOA, and EA–Modulator", IEEE Photonics Technology Letters, vol. 12, No. 3, pp. 242–244, Mar. 2000.

Kowalski et al., "A universal damage induced technique for quantum well intermixing", Applied Physics Letters, vol. 72, No. 5, Feb. 2, 1998, pp. 581–583.

\* cited by examiner

LASERS

FIELD OF INVENTION

The present invention relates to laser devices, particularly though not exclusively, semiconductor laser devices such as laser diodes, eg a single mode index guided laser diode.

BACKGROUND OF INVENTION

For many applications semiconductor laser devices are desired to operate with a substantially single spatial mode output. This output is desirable, for example, for increased coupling to single mode fibres, and for generating small spot sizes with high light intensities. Typically semiconductor laser diodes generating single mode outputs use index guided laser structures which have either a ridge or a buried heterostructure waveguide. Such laser diodes comprise, for instance as disclosed in JP-A-1 225 288, a device structure comprising a substrate, lower and upper charge carrier confining layers on said substrate, a ridge extending over a portion of said upper confining layer and laterally confining the optical mode of said laser, whereby a layer of active lasing material is sandwiched between said confining layers, said layer comprising a Quantum Well Intermixing (QWI) structure and being configured as an active region. Further provided are regions of compositionally disordered lasing material laterally bounding said active region, said disordered regions having a larger band-gap energy than said active region.

The compositionally disordered lasing material can be provided by a technique known as Quantum Well Intermixing (QWI) Well Intermixing (QWI). Various QWI techniques exist such as Impurity Induced Layer Disordering, Ion Implantation, Impurity Free Vacancy Disordering, and a Damage Induced Technique.

Though these devices provide a single spatial mode output, the total output power is limited due to the Catastrophic Optical Mirror Damage (COMD) level at the ends (facets) of the laser diode. The laser diode facet is cleaved semiconductor and as such contains a high density of vacancies and broken bonds which can lead to the absorption of generated light. Light absorbed at a laser diode facet generates heat as excited carriers recombine non-radioactively. This heat reduces the semiconductor band-gap energy leading to an increase in absorption so inducing thermal runaway which results in COMD.

Prior art techniques to improve COMD levels and consequently device lifetimes, disclose methods of fabricating Non Absorbing Mirrors (NAM) through the use of re-growth or Impurity Induced Disordering (IID) techniques and passivating the facets by evaporation of sulphur containing compounds or silicon. These methods have the disadvantage of being relatively complex.

An alternative prior art technique is to use a lossy confining waveguide which reduces the intensity on the facets by increasing the propagating optical mode size in the vertical direction or reducing wavelength confinement in the horizontal direction. Lossy confining waveguides have the disadvantage that they are susceptible to fabrication tolerances during manufacture.

It is an object of at least one aspect of the present invention to provide a laser device which obviates or mitigates at least one of the aforementioned disadvantages.

It is a further object of at least one embodiment of at least one aspect of the present invention to provide a semiconductor laser device which has a multiplied output power compared to prior art devices of similar length while retaining a substantially single lobed far field output beam profile.

SUMMARY OF INVENTION

According to a first aspect of the present invention there is provided a laser device comprising;

at least two lasing regions;

an interference region into which an output of each lasing region is coupled; and an output region extending from the interference region to an output of the device.

In a preferred and advantageous implementation, the laser device is a semiconductor laser device such as a laser diode.

Preferably the semiconductor laser device is fabricated from a III–V semiconductor materials system such as a Gallium Arsenide (GaAs) based material systems operating in a wavelength range of substantially 600 to 1300 nm, or alternatively an Indium Phosphide (InP) based material system operating in a wavelength range of substantially 1200 to 1700 nm. For example AlGaAs or InGaAsP.

Preferably each lasing region may comprise an optically active waveguide.

Preferably also the lasing regions are arranged substantially parallel to each other.

Preferably at least an input of the output region may comprise an output waveguide, and the output waveguide may be positioned transversely between output ends of the at least two active waveguides. Preferably also the at least two active waveguides may be substantially the same, eg in construction and operation. Preferably there are provided two active waveguides.

Preferably the interference region is a multi-mode interference region, ie a multi-mode interference (MMI) coupler. This arrangement provides a laser device including a multi-mode interference (MMI) coupler.

In relation to the MMI couplers for a 3 dB MMI or 1 to 2 dB MMI, two regimes may operate:

(i) an optical signal injected down a single waveguide of the coupler may be split nominally 50/50 between two waveguides of the coupler with relative phases of a given optical mode in each of the two waveguides being zero; and (ii) an optical signal injected down the two waveguides will be maximally coupled to the single waveguide when the two waveguides are substantially or effectively identical.

Thus for the present invention these features provide a laser device having an output which has a substantially single lobe in the far field.

Preferably the active waveguides may be current driven to provide optical gain in the laser device. The active waveguides may be ridge or buried heterostructure waveguides. Preferably the active waveguides may be Large Optical Cavity (LOC) waveguides, AntiResonant Reflecting Optical Waveguides (ARROW), Wide Optical Waveguides (WOW), or the like.

Preferably each active waveguide may be at least partly formed by a core layer of active lasing material sandwiched between first and second cladding/confining layers formed on a substrate. More preferably, the active lasing material may comprise or include a Quantum Well Intermixing (QWI) Well (QUANTUM WELL (QW) structure configured as an optically active region.

In a modification the active region may be laterally bounded by regions of compositionally intermixed or disordered lasing material. The disordered regions may have a larger band-gap energy and therefore a lower optical absorption than the active region.

Preferably, each active waveguide may comprise a ridge waveguide having a ridge formed in at least the second cladding layer distal the substrate.

More preferably the disordered regions may be formed by Quantum Well Intermixing (QWI) Well Intermixing (QWI). The QWI washes out the Quantum Well Intermixing (QWI) Well confinement of the wells within the core layer. The QWI may be impurity free. The QWI regions may be "blue-shifted", that is, typically at least 20 meV or 30 meV and normally 100 meV or more difference exists between the active region which is electrically pumped, in use, and the QWI passive regions which are not electrically pumped.

The output waveguide may be optionally active or passive. The output waveguide may be a ridge or buried heterostructure waveguide. Preferably the output waveguide may be a Large Optical Cavity (LOC) waveguide, Anti-Resonant Reflecting Optical Waveguide (ARROW), Wide Optical Waveguide (WOW), or the like.

Preferably the output waveguide may comprise the core layer sandwiched between the first and second cladding layers.

In one arrangement, the interference region may be optically active. However, in a preferred arrangement, the interference region may be passive. The interference region may comprise a ridge or buried heterostructure.

Preferably the interference region may comprise the core layer sandwiched between the first and second cladding layers.

Preferably also the device further comprises attenuation means. The attenuation means may comprise an etched pattern. The etched pattern may be a notch, groove or the like. Preferably the attenuation means is located on one or more faces of the interference region adjacent the active or passive waveguides. The attenuation means may be located on a face on either side of the passive waveguide and/or on a face between the active waveguides. The attenuation means may act to limit spurious reflections emanating from face surfaces which would degrade an output beam quality of the device.

Preferably the device further comprises a back end and an output end. The back end may be adjacent the active waveguides. The output end may be adjacent the output waveguide.

Preferably the back end may be back surface which may include a high reflectivity coating. More preferably the back surface may be a non-absorbing mirror (NAM). The NAM may be fabricated so that portions of the NAM at ends of the active waveguides have higher band-gap energies than remaining portions of the active waveguide. The NAMs may be fabricated by the same techniques used for the waveguides, and may be QWI regions.

Preferably the output end may comprise an output coupler so that a portion of optical radiation (light) is reflected back into the output waveguide while remaining optical radiation is output from the device. Preferably the output coupler may be a partial reflector. Alternatively the output coupler may be a NAM as described hereinbefore. Further the output coupler may comprise or include a diffractive waveguide.

Preferably the laser device may be made substantially of a III–V semiconductor material. More preferably, the device is grown on a substrate such that the device is monolithic. The device may comprise first (upper) and second (lower) electrical contact layers which may comprise metallisations. The first contact layer may cover all or parts of the second cladding layer. If the device is of a ridge structure the first contact may cover an upper/outer facing of the ridge. Alternatively the first contact layer may cover at least a portion(s) of the ridge corresponding to the active waveguides only.

According to a second aspect of the present invention there is provided a method of fabricating a laser device the device comprising:

at least two lasing regions;
an interference region into which an output of each lasing region is coupled; and
an output region extending from the interference region to an output of the device;
the method comprising the steps of:
  (i) forming, in order:
    a first optical cladding/charge carrier confining layer;
    a core layer (in which is optionally formed a Quantum Well Intermixing (QWI) structure); and
    a second optical cladding/charge carrier confining layer;
  (ii) selecting regions of the device to be the lasing regions, interference region, and output region.

Preferably the method includes the further steps of:
  (iii) forming the interference region and output region;
  (iv) defining waveguide means in the lasing regions, the interference region and the output region.

Preferably the waveguide means comprises a ridge or ridges formed in at least the second cladding layer.

Step (i) may be performed by known growth techniques such as Molecular Beam Epitaxy (MBE) or Metal Organic Chemical Vapour Deposition (MOCVD).

Preferably in step (iii) the interference region and the output region may comprise passive regions formed by a Quantum Well Intermixing (QWI) technique which may preferably comprise generating vacancies in the passive regions, or may alternatively comprise implaning or diffusing ions into the passive regions, and annealing to create regions of compositionally disordered material in the core layer having a larger band-gap than the QW structure.

The passive regions may therefore be formed by Quantum Well Intermixing (QWI) Well Intermixing (QWI).

Preferably step (iv) may be achieved by known etching techniques, eg dry or wet etching.

Preferably the method may begin by providing a substrate onto which is grown the first cladding layer, core layer and second cladding layer, in order.

Preferably, step (iii) may be performed by generating impurity free vacancies and more preferably may use a damage induced technique to achieve Quantum Well Intermixing (QWI).

In a preferred implementation of such a technique, the method may include the steps of:

depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer. Such a technique is described in co-pending application entitled "Method of Manufacturing Optical Devices and Related Improvements" also by the present Applicant, and having the same filing date as the present application, the content of which is incorporated herein by reference.

Preferably, the method may include the step of applying one contact layer to a surface of the first cladding layer, or more preferably the substrate, and another contact layer to a surface of the ridge.

In a modification, another layer may be grown on the second cladding layer at least part of which another layer may comprise a portion or portions of the ridge.

Preferably the active waveguides may be optically active regions and the interference region and the output region may be optically passive regions.

In a modification, the method may include, preferably in step (iii), forming regions of compositionally disordered lasing material laterally bounding the lasing regions. These may assist the ridge in confining the optical mode(s) of the device.

Advantageously a further region of compositionally disordered lasing material may be formed adjacent to the output region. This further region may be wider than the output region and may act, in use, as a diffractive region at an output end of the laser device.

BRIEF DESCRIPTION OF DRAWINGS

Embodiments of the present invention will now be described by way of example only, with reference to the accompanying drawings, which are.

DETAILED DESCRIPTION OF DRAWINGS

Figure 1:
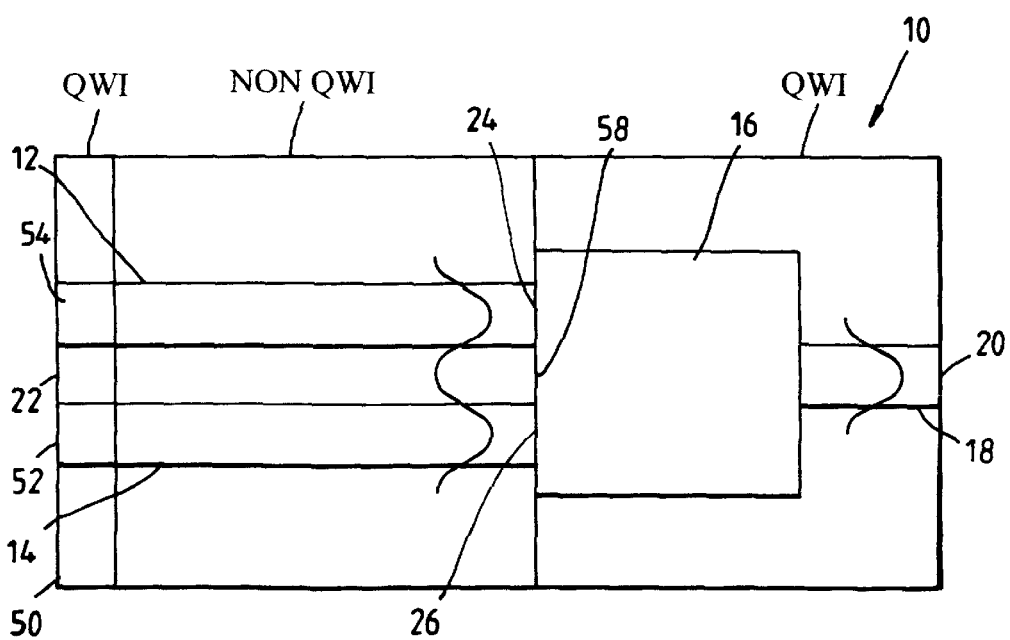
FIG. 1 a cross-sectional view of a laser device according to a first embodiment of the present invention.
Figure 2:
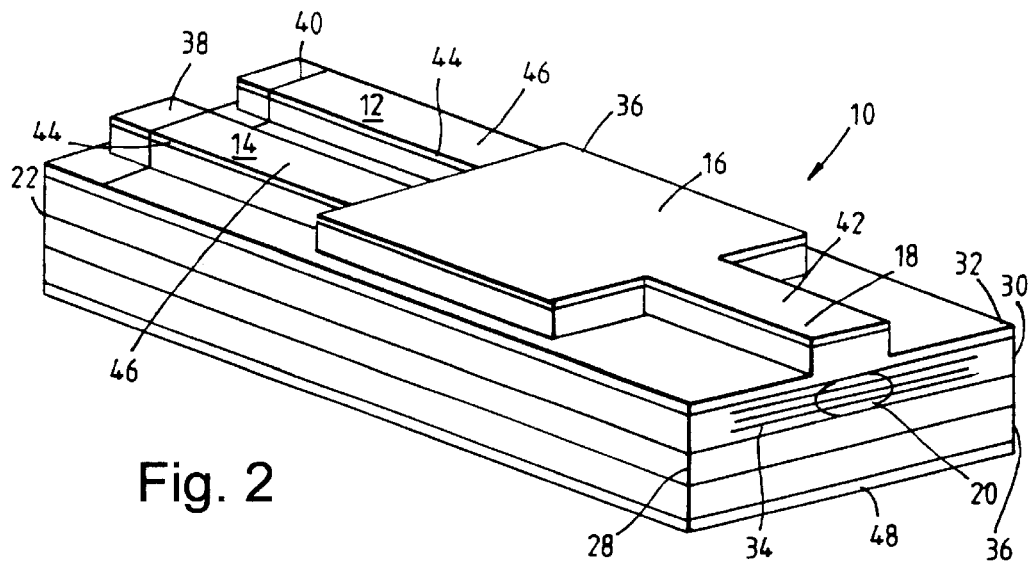
FIG. 2 a schematic perspective view from one side, one end and above of the laser device of FIG. 1.

Referring initially to FIGS. 1 and 2, there is illustrated a laser device, generally designated 10, according to a first embodiment of the present invention. Device 10 is in this embodiment a semiconductor device in the form of a laser diode comprising lasing regions in the form of optically active waveguides 12,14, an interference region 16 into which is coupled an output of each active waveguide 12, 14, and an output waveguide 18 extending from an output of the interference region 16 to an output 20 of the device 10.

Active waveguides 12, 14 are in this embodiment, substantially identical to one another and arranged in substantially parallel relation one to another and in substantially transverse relation to a back surface 22 of device 10. The output waveguide 18 is positioned transversely substantially at a midpoint between ends 24, 26 of the active waveguides 12, 14.

The interference region 16 is a multi-mode interference region, and is known in the art as a Multi-Mode Interference (MMI) coupler. Output beams from the active waveguides 12, 14 interfere within the MMI coupler 16, which is a multimode waveguide. In use, the MMI coupler 16 provides a single lobe output in the farfield from the output 20. The MMI coupler 16 comprises a waveguide designed to support a larger number of modes (typically more than or equal to 3). In order to launch light into and recover light from that multimode waveguide, a number of access (usually single-moded) waveguides are provided at its input end and at its output end. Such MMI devices are generally referred to as N×M MMI couplers, where N and M are the number of input and output waveguides respectively. In this case N is more than or equal to 2, and M=1. MMI couplers have been reported in the literature, eg "Useful Formulas for Multimode Interference Power Splitter/Combine Design", FERRERAS etal, IEEE Photonics Tech.lett, Vol 5, No 10, October 1993, pp 1224–1227; "Optical Multi-Mode Interference Devices Based on Self-Imagity: Principles and Applications", SOLDANO etal, Journal of Lightwave tech, Vol 13, No 4, April 1995, pp 615–627, the content of which are incorporated herein by reference.

Referring now specifically to FIG. 2. FIG. 2 shows the structure of the device 10, including the layered structure of the material from which the device 10 is fabricated. The device 10 comprises a substrate 36, first (lower) optical cladding/charge carrier confining layer 28, a core guiding/active lasing layer 30, and a second upper optical cladding/charge carrier confining layer 32. The core layer 30 is as described hereinbefore with reference to FIG. 1, and comprises an active lasing material including a Quantum Well Intermixing (QWI) structure(s) 34.

A method of fabricating the device 10 begins with a provision of a substrate layer 36. The substrate 36 in this embodiment is Gallium Arsenide (GaAs) and is highly n-type doped. Grown on the substrate layer 36 is the first cladding layer 28. The first cladding layer 28 comprises Aluminium Gallium Arsenide (AlGaAs,) and is n-type doped to a first concentration. This first cladding layer 28, eg having a refractive index of around 3.0–3.5, is typically around 1 to 3 $\mu$m thick.

Grown on the first cladding layer 28 is the core guiding layer 30, which also comprises AlGaAs. Core guiding layer 30 may be substantially intrinsic or n-type doped but to a second concentration. The core guiding layer 30, eg having a refractive index of around 3.0 to 3.5 is grown to be a few hundred nm thick. Within the active layer 30 is embedded a Quantum Well Intermixing (QWI) structure 34. This QW structure 34 is embedded in the middle of the layer 30 distal the substrate 36.

On the active layer 30 is grown the second cladding layer 32. The second cladding layer 32 is of p-type with a substantially equal doping concentration to the first concentration. The second cladding layer 32 is also made of AlGaAs with a thickness and refractive index similar to that of the first cladding layer 28. Thus the Quantum Well Intermixing (QWI) structure 34 is sandwiched between p-type and n-type cladding layers 32 and 28 respectively. The active layer 30 has a higher refractive index than the cladding layers 28,32.

A selective QWI mask (not shown) is then placed over portions of the device so as to leave portions to be QWI masked. These portions are the interference region 16 and the output waveguide 18. The technique preferably used to create Quantum Well Intermixing (QWI) within the Quantum Well Intermixing (QWI) structure is a damage induced technique using vacancies. However, it will be understood that any other Quantum Well Intermixing (QWI) technique which achieves a difference in the band-gap energy between the Quantum Well Intermixing (QWI) structure 34 and the QW intermixed regions 16, 18 could be used within this invention. The damage induced technique requires depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer.

During fabrication, once the device 10 has been annealed, portions of the second cladding layer 32a on either side of where ridges 36, 38, 40, 42 are to be formed, are etched away by known lithographic techniques once a suitable etch mask has been placed over are to be formed the areas defining the ridges 36, 38, 40, 42.

During growth of the material a final layer may be grown, that layer being a highly doped p-type GaAs layer 44. The highly doped layer 44 acts as the upper contact layer for the device 10. Thus the device 10a shown in FIG. 2 is a monolithic semiconductor laser device. The lasing regions 12, 14 of the laser device 10 are within the active layer 30 and confined in the Quantum Well Intermixing (QWI) structure 34 by the ridges 38, 40 above. The QW intermixed regions 16, 18 of the active layer 30 will have a higher band-gap energy and lower absorption than the Quantum Well Intermixing (QWI) structure 34 as originally grown, and as retained in the lasing regions, ie active waveguides 12,14.

In a modification, altering the size of the mask and by carrying out QWI more than once on the device 10, further QWI regions (not shown) may also be created laterally, ie on either side, of the active waveguides 12,14 to aid further confinement of the optical mode. Additionally QWI may be carried out at one or both ends 20,22 of the device 10 to create a diffractive portion or portions.

In use, the device 10 is driven by the injection of current via contact metallisations 46,48 on the ridges 38,40 and a surface of the substrate 36 respectively. Gain regions are created in the active waveguides 12, 14 and together with reflective coatings at the back surface 22 and the output facet 20, a laser resonator is defined with the MMI coupler filtering high order modes to leave substantially the fundamental as the optical output in use.

The back surface 22 has a highly reflective coating, ie typically >90% and in the first embodiment, shown in FIG. 1 and 2, Non-Absorbing Mirrors (NAMs) 52,54 are also used as back reflectors. Portions of the NAMs 52, 54, under the ridges 58, 40a are QWI regions to reduce heating at the back surface 22. At the output 20 an anti-reflective coating (not shown) is used to reflect a portion of produced light back into the device 10 while the remainder forms an output of the device 10.

Figure 3:
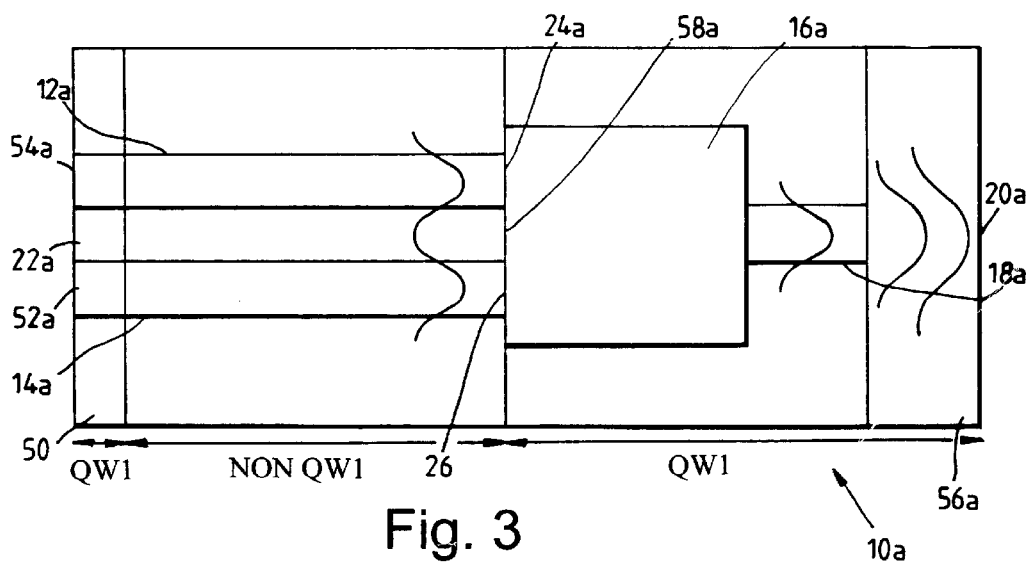
FIG. 3 a cross-sectional view of a laser according to a second embodiment of the present invention.

Referring now to FIG. 3 there is shown a laser device, ie generally designated 10a, according to a second embodiment of the present invention. The device 10a is substantially similar to device 10 and accordingly like parts are identified by the same nomenclature but suffixed "a". The construction and operation of device 10a is substantially as described hereinbefore with regard to device 10 of FIGS. 1 and 2, except for the addition of a diffractive region 56a at an output of the device 10a. Diffractive region 56a comprises a compositionally disordered lasing material (QWI material) within the active layer 30a which is broader than the width of the output waveguide 18a. Diffractive region 56a is formed by QWI as described hereinbefore. The diffractive region 56a in operating as a diffractive waveguide allows the device 10a to have an increased output power compared to the device 10 of the first embodiment as the output beam is spread over the output end facet 20a. This reduction of intensity on the output facet 20a means that the output power can be increased to a greater level before Catastrophic Optical Mirror Damage (COMD) occurs.

It will be understood by those skilled in the art that modifications may be made to the present invention without departing from the scope thereof.

It will be particularly appreciated that a principal advantage of the present invention is that by the use of an interference region within the device, increased output power and a narrow horizontal far-field beam pattern are attainable in a device of given length as compared to prior art devices of said given length.

What is claimed is:

1. A laser device comprising:

only two optically active waveguides, the optically active waveguides being substantially identical to one another;

an interference region into which output ends of the optically active waveguides are coupled such that output beams from the optically active waveguides interfere with each other in the interference region; and an output waveguide extending from the interference region to an output end of the device, the output waveguide positioned transversely substantially at a midpoint between the output ends of the optically active waveguides, an output end of the device providing a single lobe farfield output;

the device being configured such that an optical signal injected into the output end of the device splits nominally equally between the two optically active waveguides and, for a given optical mode in the two optically active waveguides, the relative phase difference between the two active waveguides is zero.

2. A laser device as claimed in claim 1, wherein the laser device is a semiconductor laser device.

3. A laser device as claimed in claim 2, wherein the semiconductor laser device is fabricated from a III–V semiconductor materials system.

4. A laser device as claimed in claim 3, wherein the III–V semiconductor materials system is selected from a Gallium Arsenide (GaAs) based material systems operating in a wavelength range of substantially 600 to 1300 nm and an Indium Phosphide (InP) based material system operating in a wavelength range of substantially 1200 to 1700 nm.

5. A laser device as claimed in claim 1, wherein the optically active waveguides are arranged substantially parallel to each other.

6. A laser device as claimed in claim 1, wherein the interference region comprises a Multi-Mode Interference (MMI) coupler.

7. A laser device as claimed in claim 1, wherein the optically active waveguides are current driven to provide optical gain in the laser device.

8. A laser device as claimed in claim 1, wherein the optically active waveguides are ridge or buried heterostructure waveguides.

9. A laser device as claimed in claim 1, wherein the optically active waveguides are selected from Large Optical Cavity (LOC) waveguides, AntiResonant Reflecting Optical Waveguides (ARROW), and Wide Optical Waveguides (WOW).

10. A laser device as claimed in claim 1, wherein each optically active waveguide is at least partly formed by a core layer of active lasing material sandwiched between first and second cladding layers formed on a substrate.

11. A laser device as claimed in claim 10, wherein the active lasing material includes a Quantum Well Intermixing (QWI) structure configured as an optically active region.

12. A laser device as claimed in claim 11, wherein the active region is laterally bounded by regions of compositionally intermixed or disordered lasing material, the disordered regions having a larger band-gap energy and a lower optical absorption than the active region.

13. A laser device as claimed in claim 10, wherein each optically active waveguide comprises a ridge waveguide having a ridge formed in at least the second cladding layer distal the substrate.

14. A laser device as claimed in claim 10, wherein the device comprises first and second electrical contact layers, the first contact layer covering at least parts of the second cladding layer.

15. A laser device as claimed in claim 12, wherein the disordered regions are formed by Quantum Well Intermixing (QWI).

16. A laser device as claimed in claim 1, wherein the output waveguide is optically passive.

17. A laser device as claimed in claim 1, wherein the output waveguide is a ridge or buried heterostructure waveguide.

18. A laser device as claimed in claim 1, wherein the output waveguide is selected from the group consisting of a Large Optical Cavity (LOC) waveguide, AntiResonant Reflecting Optical Waveguide (ARROW), and a Wide Optical Waveguide (WOW.

19. A laser device as claimed in claim 1, wherein the output waveguide comprises a core layer sandwiched between first and second cladding layers.

20. A laser device as claimed in claim 1, wherein the interference region is optically active.

21. A laser device as claimed in claim 1, wherein the interference region is optically passive.

22. A laser device as claimed in claim 1, wherein the interference region comprises a ridge or buried heterostructure.

23. A laser device as claimed in claim 1, wherein the interference region comprises a core layer sandwiched between first and second cladding layers.

24. A laser device as claimed in claim 1, wherein also the device further comprises attenuation means.

25. A laser device as claimed in claim 24, wherein the attenuation means comprises an etched pattern.

26. A laser device as claimed in claim 24, wherein the attenuation means is located on one or more faces of the interference region adjacent the optically active or output waveguides.

27. A laser device as claimed in claim 26, wherein the attenuation means is located on a face on a side of the output waveguide, on a face between the optically active waveguides, or on both of the last said faces.

28. A laser device as claimed in claim 1, wherein the device further comprises a back end and an output end, the back end being adjacent the active waveguides, the output end being adjacent the output waveguide.

29. A laser device as claimed in claim 28, wherein the back end is a back surface which includes a high reflectivity coating.

30. A laser device as claimed in claim 28, wherein the back surface is a non-absorbing mirror (NAM).

31. A laser device as claimed in claim 28, wherein the output end comprises an output coupler so that a portion of optical radiation is reflected back into the output waveguide while remaining optical radiation is output from the device.

32. A laser device as claimed in claim 31, wherein the output coupler is either a partial reflector or a NAM.

33. A laser device as claimed in claim 31, wherein the output coupler includes a diffractive waveguide.

34. A laser device as claimed in claim 1, wherein the laser device is made substantially of a III–V semiconductor material, the device being grown on a substrate such that the device is monolithic.

* * * * *